(12) United States Patent
Maldo et al.

(10) Patent No.: US 12,308,338 B2
(45) Date of Patent: May 20, 2025

(54) POWER SUBSTRATE ASSEMBLY WITH REDUCED WARPAGE

(71) Applicant: Littelfuse, Inc., Chicago, IL (US)

(72) Inventors: Tiburcio A. Maldo, Cebu (PH); Rhodri Hughes, Swindon (GB); Robert Ebido, Batangas (PH); Jeff Grozen, Muntinlupa (PH); Josef Colquin A. Chua, Batangas (PH); Domingo Atienza, Jr., Batangas (PH)

(73) Assignee: Littelfuse, Inc., Chicago, IL (US)

( * ) Notice: Subject to any disclaimer, the term of this patent is extended or adjusted under 35 U.S.C. 154(b) by 473 days.

(21) Appl. No.: 17/864,881

(22) Filed: Jul. 14, 2022

(65) Prior Publication Data

US 2024/0021568 A1 Jan. 18, 2024

(51) Int. Cl.
*H01L 23/00* (2006.01)
*H01L 23/14* (2006.01)
*H01L 23/15* (2006.01)

(52) U.S. Cl.
CPC ............ *H01L 24/37* (2013.01); *H01L 23/142* (2013.01); *H01L 23/15* (2013.01); *H01L 24/40* (2013.01); *H01L 24/32* (2013.01); *H01L 24/73* (2013.01); *H01L 2224/32225* (2013.01); *H01L 2224/32245* (2013.01); *H01L 2224/37005* (2013.01); *H01L 2224/37011* (2013.01); *H01L 2224/37013* (2013.01); *H01L 2224/3702* (2013.01); *H01L 2224/37026* (2013.01); *H01L 2224/40225* (2013.01); *H01L 2224/40245* (2013.01);

(Continued)

(58) Field of Classification Search
CPC ....................................................... H01L 24/37
See application file for complete search history.

(56) References Cited

U.S. PATENT DOCUMENTS 5,544,412 A * 8/1996 Romero ................. H01L 24/91
361/767
2007/0205501 A1 9/2007 Lee
(Continued)

FOREIGN PATENT DOCUMENTS

CN 108780786 A 11/2018
CN 113574668 A 10/2021
(Continued)

OTHER PUBLICATIONS

European Search Report for EP Application No. 23182821.1, dated Nov. 28, 2023, 15 pages.
(Continued)

*Primary Examiner* — Matthew L Reames
(74) *Attorney, Agent, or Firm* — KDW Firm PLLC

(57) ABSTRACT

A substrate assembly may include a power substrate, a chip, a clip, and a trimetal. The power substrate has a first direct copper bonded (DCB) surface connected to a ceramic tile. The chip is soldered onto the first DCB surface. The clip is attached to the power substrate and has a foot at one end and a recessed area at the other, opposite end. The foot is connected to the power substrate. The trimetal has a base, a trapezoid structure, and a clip portion. The base is soldered to the chip. The trapezoid structure is located above the base. The clip portion is located above the trapezoid structure and includes a projecting area. The recessed area of the clip fits into the projecting area of the trimetal.

11 Claims, 2 Drawing Sheets

(52) U.S. Cl.
CPC ............... *H01L 2224/73263* (2013.01); *H01L 2924/3511* (2013.01)

(56) References Cited

U.S. PATENT DOCUMENTS

| | | |
|---|---|---|
| 2012/0115339 A1 | 5/2012 | Schaarschmidt |
| 2013/0082387 A1 | 4/2013 | Stolze |
| 2015/0364847 A1 | 12/2015 | Yao |
| 2022/0157672 A1 | 5/2022 | Takahashi |
| 2023/0369277 A1 | 11/2023 | Seddon |

FOREIGN PATENT DOCUMENTS

| | | |
|---|---|---|
| EP | 3584829 A1 | 12/2019 |
| JP | 2004047800 A | 2/2004 |
| JP | 2008140788 A | 6/2008 |
| TW | 200824083 A | 6/2008 |

OTHER PUBLICATIONS

European Search Report for EP Application No. 23182772.6, dated Dec. 11, 2023, 4 pages.
European Search Report for EP Application No. 23182821.1, dated Feb. 19, 2024, 13 pages.

\* cited by examiner

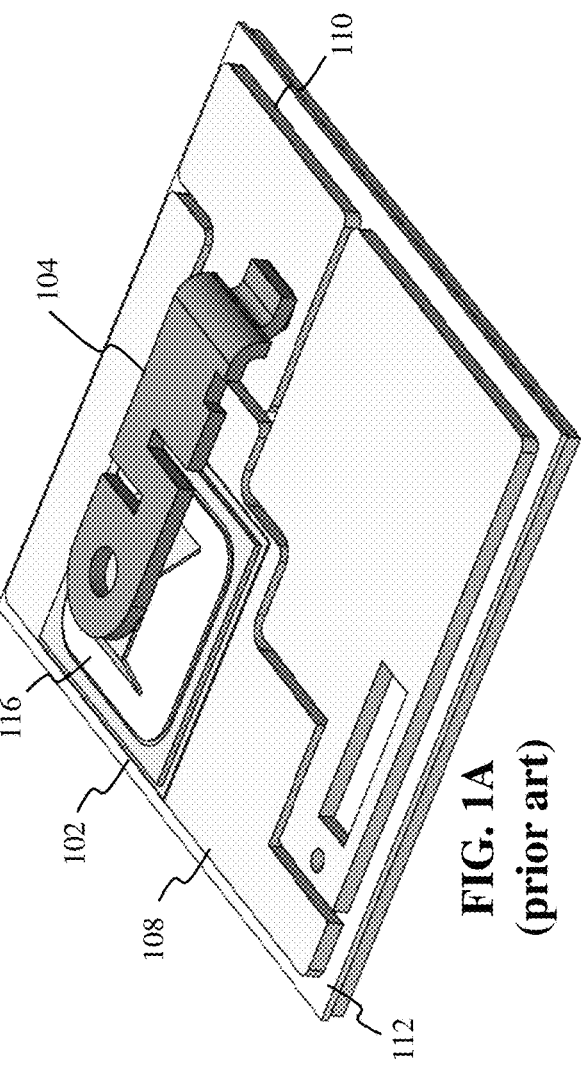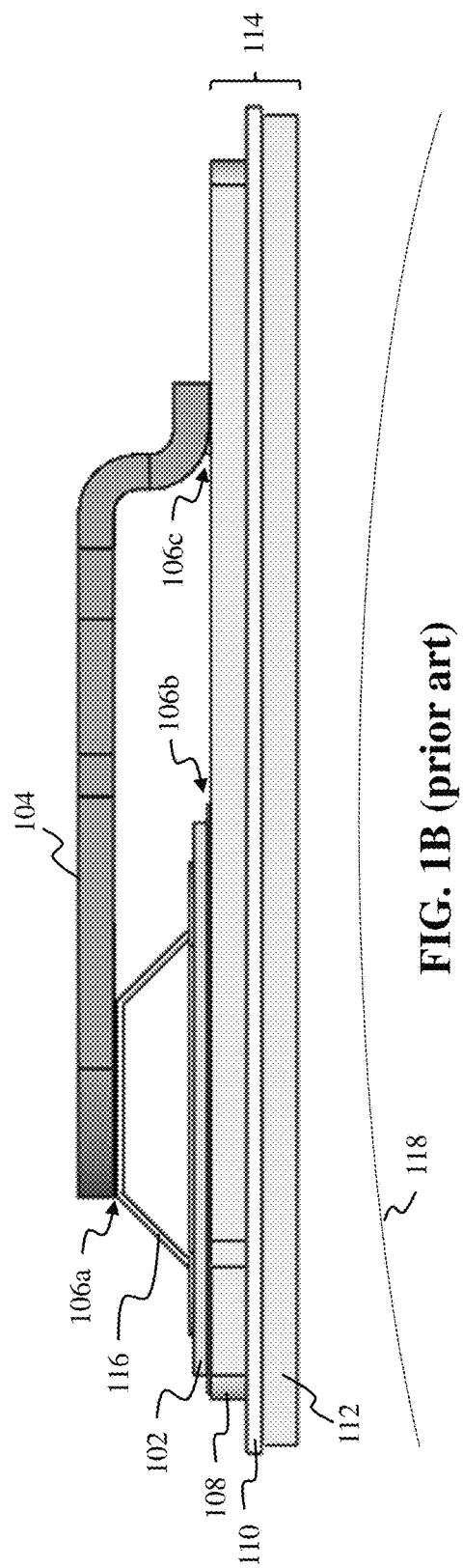

POWER SUBSTRATE ASSEMBLY WITH REDUCED WARPAGE

FIELD OF THE DISCLOSURE

Embodiments of the present disclosure relate to power substrates and, more particularly, to warpage issues for these substrates.

BACKGROUND

Substrates for power electronics are different than printed circuit boards used for low power microelectronics. The power electronics substrate both provides the interconnections to form an electrical circuit and cool the components. Power electronic substrates carry higher currents and provide a higher voltage isolation (up to several thousand volts), as compared to microelectronic counterparts, and operate over a wide temperature range (e.g., up to 200° C.).

Direct bonded copper (DBC), also known as direct copper bonded (DCB) substrates, have very good thermal conductivity, and are thus suitable for power modules. DCBs are composed of a ceramic tile with a sheet of copper bonded to one or both sides of the ceramic tile. Insulated metal substrates (IMS) are also used for power modules and consist of a metal baseplate covered by a thin layer of dielectric and a layer of copper. IMS are single-sided substrates.

A problem that exists for power substrates having DCB layers is known as DCB warpage. DCB warpage occurs when there is a mismatch of the coefficient of thermal expansion (CTE) of the components being soldered onto the DCB surface. This warpage may also occur on single-sided IMS substrates.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a power substrate assembly in accordance with the present disclosure may include a power substrate, a chip, a clip, and a trimetal. The power substrate has a first surface connected to a ceramic tile. The chip is soldered onto the first surface. The clip is attached to the power substrate and has a foot at one end and a recessed area at the other, opposite end. The foot is connected to the power substrate. The trimetal has a base, a trapezoid structure, and a clip portion. The base is soldered to the chip. The trapezoid structure is located above the base. The clip portion is located above the trapezoid structure and includes a projecting area. The recessed area of the clip fits into the projecting area of the trimetal.

BRIEF DESCRIPTION OF THE DRAWINGS

FIGS. 1A-1B are diagrams of power substrate warpage, in accordance with the prior art.

DETAILED DESCRIPTION

Figure 2B:
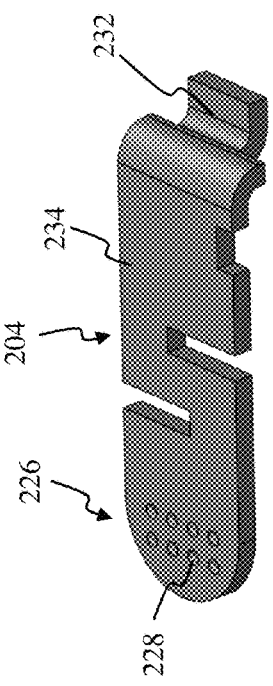
FIGS. 2A-2E are diagrams illustrating a power substrate assembly to address power substrate warpage, in accordance with exemplary embodiments.

A power substrate assembly designed to reduce power substrate warpage is disclosed herein. The power substrate has a ceramic tile sandwiched between two DCB surfaces, or alternatively a ceramic tile adjacent a single DCB surface. The power substrate assembly features a clip and a trimetal to avoid power substrate warpage. The trimetal has a button array and the clip has a cavity array, where the button array is designed to mate with the cavity array. In contrast to prior art designs, the arrangement mitigates the likelihood of warpage to the power substrate. Modifications are made to the ceramic tile to further improve resistance to DCB warpage of the power substrate.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

As used herein, power substrates refer variously to direct bonded copper (DBC), also known as direct copper bonded (DCB) substrates and insulated metal substrates (IMS). The principles shown and described herein may refer to either of these types of substrates. For simplicity, these substrates are referred to as power substrates.

FIGS. 1A-1B are representative drawings of a power substrate assembly 100 experiencing warpage, according to the prior art. FIG. 1A is a perspective view and FIG. 1B is a side view of the power substrate assembly 100. The power substrate assembly 100 features a power chip 102 (hereinafter, "chip 102") that is soldered to a power substrate 114, where the power substrate 114 consists of a first surface 108 and a second surface 112, with a ceramic tile 110 sandwiched therebetween. The first surface 108 and the second surface 112 may be direct copper bonded (DCB) substrates. The substrate assembly 100 may alternatively have a single surface 108, thus making the power substrate an insulated metal substrate (IMS). The power substrate assembly 100 also features a clip 104 and a trimetal 116, where the trimetal 116 connects the chip 102 to the clip 104. Solder 106a, 106b, and 106c (collectively, "solder 106") are used to make connections between parts, with solder 1206a connecting the clip 104 to the trimetal 116, solder 106b connecting the chip 102 to the power substrate 114, and solder 106c connecting the clip 104 to the power substrate 114.

In FIG. 1B, a DCB warpage line 118 shows how the power substrate 114 bends over the lifetime of the power substrate assembly 100. Though perhaps more pronounced for illustrative purposes, the DCB warpage line 118 makes it possible to imagine the effects such a bending of the power substrate 114 could compromise one or more of the solders 106, particularly those connecting directly to the power substrate 114 (e.g., solder 106b and 106c).

Figure 2C:
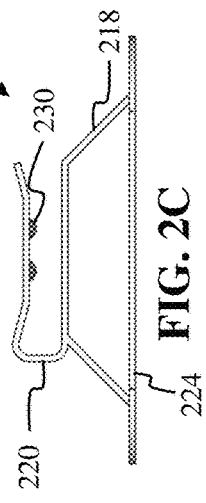
Figure 2D:
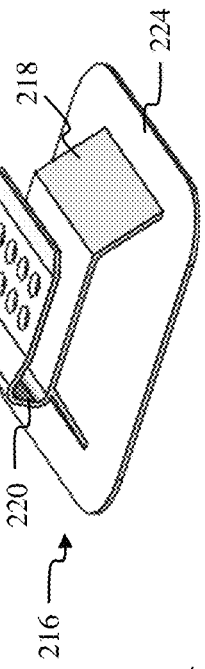
Figure 2A:
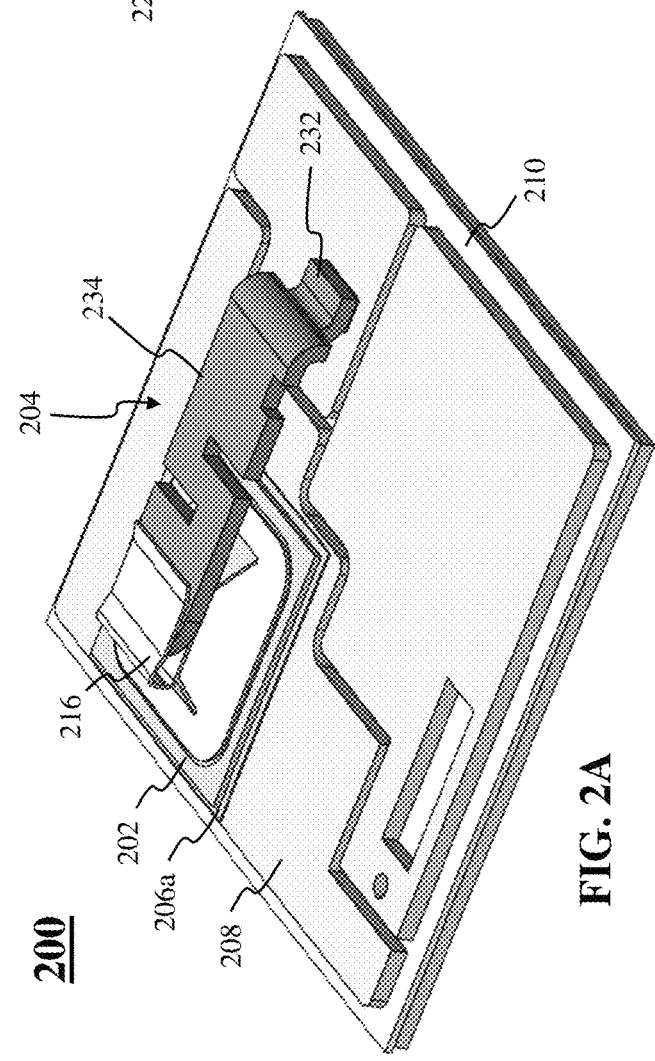
Figure 2E:
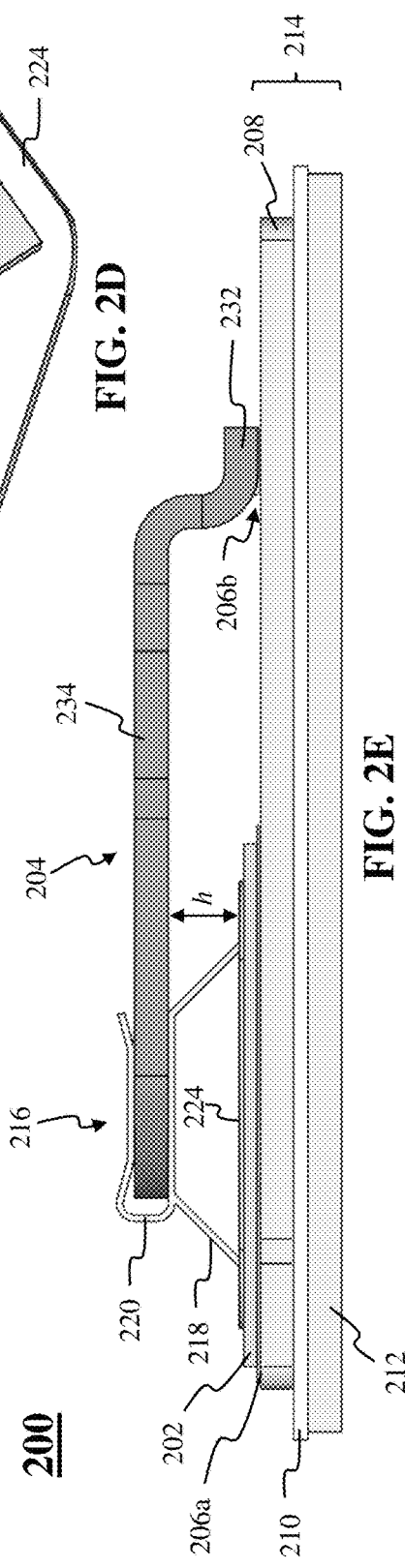

FIGS. 2A-2E are representative drawings of a power substrate assembly 200, according to exemplary embodiments. FIG. 2A is a perspective view and FIG. 2E is a side view of the power substrate assembly 200, while FIG. 2B is a perspective view of the clip 204, FIG. 2C is a side view of the trimetal 216, and FIG. 2D is a perspective view of the trimetal 216. The power substrate assembly 200 enables some components to be coupled together without the use of solder, in exemplary embodiments.

The trimetal 216 consists of a trapezoid structure 218, a clip portion 220, and a base 224. The trapezoid structure 218 sits atop the base 220 and is sandwiched between the base 220 and the clip 220. In a non-limiting example, the base 220 is a rounded rectangular shape, that fits atop a power chip 202 (hereinafter, "chip 202") within the diameter of the chip 202. In exemplary embodiments, the trimetal 216 consists of a button array 222 for coupling with the clip 204. In this example, there are two rows of buttons 230 in the button array 222, though this is not meant to be limiting. As shown in FIG. 2D, the buttons 230 of the button array 222 are disposed on a bottom surface of the clip portion 220 of the trimetal 216.

The clip 204 consists of a base 234 and a foot 232, where the base is substantially parallel to the power substrate 214 and the foot 232 is for connection to the power substrate 214 using solder 206b, while the chip 202 is connected to the power substrate 214 using solder 206a (collectively, "solder 206"). In exemplary embodiments, the solder 206a is either solder or silver (Ag) sintering while the solder 206b is solder.

In exemplary embodiments, the clip 204 further includes a cavity array 226, the cavity array having multiple cavities 228. In this example, there are two rows of cavities 228 forming the cavity array 226, though this is not meant to be limiting. The cavity array 226 is disposed on a top surface of the base 234 of the clip 204. In exemplary embodiments, the base 234 of the clip 204 is designed to fit into the clip portion 220 of the trimetal 216. Further, the cavity array 226 of the clip 204 is sized to receive the button array 222 of the trimetal 216 such that each individual button 230 of the button array 222 fits into respective cavities 228 of the cavity array 226. Alternatively, the clip 234 could feature a button array while the trimetal 216 features a cavity array.

In exemplary embodiments, the trapezoid structure 218 of the trimetal 216 is sized to be a height, h, based on the configuration of the clip 204, so that, when the base 234 of the clip 204 is positioned into the clip portion 220 of the trimetal 216, the foot 232 of the clip 204 sits on the power substrate 214. For the power substrate assembly 200, no solder is used to connect the clip 204 to the trimetal 216. Instead, the button array 222 of the trimetal 216 fits into the cavity array 226 of the clip 204. Thus, in exemplary embodiments, even if the power substrate 214 experiences warpage, the clip 204 will remain coupled to the trimetal 216.

The power substrate assembly 200 thus features a power substrate 214 having a first DCB surface 208 connected to a ceramic tile 210, a chip 202 soldered onto the first DCB surface 208, a clip 204 to be attached to the power substrate 214, and a trimetal 216 to connect the chip 202 to the clip 204. The clip 204 has a foot 232 at one end that is soldered to the power substrate 214 and a recessed area at the other end of the clip 204. The recessed area may be a cavity array 226 featuring one or more cavities 228. The trimetal 216 connects the chip 202 to the clip 204 and has a base 224 to be soldered to the chip 202, a trapezoid structure 218 seated atop the base 224, and a clip portion 220 on top of the trapezoid structure 218, the clip portion 220 having a projecting area. The projecting area may be a button array 222 featuring one or more buttons 230. The buttons 230 and the cavities 228 are arranged so that each button 230 fits snugly into each respective cavity 228. The recessed area of the clip 204 fits into the projecting area of the trimetal 216.

Table 1 provides a comparison between the materials used in power substrates versus using the power substrate assembly 200 disclosed herein. K88 is a leadframe manufacturer that uses copper and alloys to make the lead terminals both strong and flexible, resulting in a spring-like quality to the leads. Rthjc is the impedance from junction to case (outside surface of package). In exemplary embodiments, the clip 204 for the above-described power substrate assembly 200 is impregnated with a material to make the clip springier yet maintain hardness. Where lead frames typically have a hardness vector (HV) of 100 to 130, in exemplary embodiments, the clip 204 of the power substrate assembly 200 has a HV of between 140 and 170. Further, in exemplary embodiments, where prior art power substrates typically used Aluminum Oxide ($Al_2O_3$), Aluminum Nitride (AlN), or Zirconia Toughened Alumina (ZTA), the power substrate assembly 200 utilizes ceramic made of $Si_3N_4$ (Silicon Nitride) for better performance rather than AlN. Further, by using a pressure contact clip (e.g., clip 204) rather than a soldered clip in the power substrate assembly 200, the clip has a self-cleaning capability, that is, the clip 204 self-cleans the surface to maintain a good connection to the tri-metal 216, in exemplary embodiments.

TABLE 1

Comparison between prior art and new technology

| Prior art | Disclosed art | Advantage |
|---|---|---|
| Uses industry standard softer copper material like TAMACA, KFC, 12Sn, PMC90 | Uses K88 harder leadframe material (140~170 hardness value) or equivalent material due to pressured contact requirement when inserted into power substrate cavity | Sturdy leadframe, hard wearing |
| Soldered power terminal | No solder connection | High reliability performance due to the absence of solder; high current carrying capability |
| Higher DCB warpage | Minimal DCB warpage | Better thermal performance (lower Rthjc) |
| Soldered clip | Pressure contact clip | Self-cleaning during expansion/contraction Joint connection |

In exemplary embodiments, the ceramic tile used for the power substrate assembly 200 is modified from prior art power assemblies to enhance the strength of the power substrate. Table 2 provides characteristic data about the ceramic tile. In exemplary embodiments, thermal conductivity, bending strength, and fracture toughness are all considered when selecting the ceramic tile for the power substrate assembly 200. In exemplary embodiments, the ceramic tiles are made using Silicon Nitride ($Si_3N_4$), with a favorable combination to thermal conductivity, bending strength, and toughness, as compared to standard $Al_2O_3$, AlN, or ZTA.

TABLE 2

Characteristics of ceramic tile

| | $Al_2O_3$ 96% | AlN | ZTA (9%) | $Si_3N_4$ |
|---|---|---|---|---|
| Thermal conductivity (W/mK) | 24 | 180 | 28 | 90 |
| Bending strength (MPa) | 450 | 300 | 700 | 650 |
| Fracture toughness (MPa√m) | 3, 8-4, 2 | 3-3, 4 | 4, 5-5 | 6, 5-7 |

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A substrate assembly comprising:
   a power substrate comprising a first direct copper bonded (DCB) surface coupled to a ceramic tile;
   a chip soldered onto the first DCB surface;
   a clip attached to the power substrate, the clip comprising:
      a foot coupled to the power substrate, wherein the foot is disposed at a first end of the clip; and
      a recessed area disposed at a second end of the clip, the second end being opposite the first end; and
   a trimetal comprising:
      a base soldered to the chip;
      a trapezoid structure disposed atop the base; and
      a clip portion disposed atop the trapezoid structure, the clip portion further comprising a projecting area;
   wherein the recessed area of the clip fits into the projecting area of the trimetal.

2. The substrate assembly of claim 1, wherein the recessed area comprises an array of cavities.

3. The substrate assembly of claim 2, wherein the projecting area comprises an array of buttons.

4. The substrate assembly of claim 3, wherein each cavity of the array of cavities is sized to fit each button of the array of buttons.

5. The substrate assembly of claim 1, wherein the foot is soldered to the power substrate.

6. The substrate assembly of claim 1, wherein the recessed area comprises an array of buttons.

7. The substrate assembly of claim 2, wherein the projecting area comprises an array of cavities.

8. The substrate assembly of claim 1, further comprising a second DCB surface, wherein the ceramic tile is sandwiched between the first DCB surface and the second DCB surface.

9. The substrate assembly of claim 8, wherein the power substrate is a DCB substrate.

10. The substrate assembly of claim 1, wherein the power substrate is an insulated metal substrate.

11. The substrate assembly of claim 1, wherein the ceramic tile is Silicon Nitride ($Si_3N_4$).

* * * * *